United States Patent
Bovington et al.

(10) Patent No.: US 11,133,645 B2
(45) Date of Patent: Sep. 28, 2021

(54) LASER INTEGRATION INTO A SILICON PHOTONICS PLATFORM

(71) Applicant: Cisco Technology, Inc., San Jose, CA (US)

(72) Inventors: Jock T. Bovington, La Mesa, CA (US); Kenneth J. Thomson, San Francisco, CA (US); Dominic F. Siriani, Allentown, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/364,994

(22) Filed: Mar. 26, 2019

(65) Prior Publication Data
US 2020/0127438 A1   Apr. 23, 2020

Related U.S. Application Data

(60) Provisional application No. 62/748,177, filed on Oct. 19, 2018.

(51) Int. Cl.
*H01S 5/026* (2006.01)
*H01S 5/02* (2006.01)
(Continued)

(52) U.S. Cl.
CPC ............ *H01S 5/026* (2013.01); *H01S 5/0042* (2013.01); *H01S 5/021* (2013.01); *H01S 5/0202* (2013.01);
(Continued)

(58) Field of Classification Search
CPC ............... H01S 5/0224; H01S 5/02248; H01S 5/02252; H01S 5/0217; H01S 5/0262;
(Continued)

(56) References Cited

U.S. PATENT DOCUMENTS

| 5,644,667 A * | 7/1997 | Tabuchi | G02B 6/1221 |
| | | | 385/131 |
| 2005/0053319 A1* | 3/2005 | Doan | G02B 6/12 |
| | | | 385/14 |

(Continued)

OTHER PUBLICATIONS

Chen et al., "Electrically pumped continuous-wave 1.3 ?m InAs/GaAs quantum dot lasers monolithically grown on on-3XiS Si (001) substrates," Optics Express, vol. 25, No. 5, Mar. 2017, 8 pages.

(Continued)

*Primary Examiner* — Tod T Van Roy
*Assistant Examiner* — Sean P Hagan
(74) *Attorney, Agent, or Firm* — Patterson + Sheridan, LLP

(57) ABSTRACT

The present disclosure provides for laser integration into photonic platforms in which a first wafer, including a first substrate and a first insulator that includes a first plurality of dies that each include a first set of optical waveguides, is bonded to a second wafer, including a second substrate and a second insulator that includes a second plurality of dies that each include a second set of optical waveguides. The bond between the two wafers defines a wafer bond interface joining the first insulator with the second insulator and vertically aligning the first plurality of dies with the second plurality of dies such that respective first sets of optical waveguides are optically coupled with respective second sets of optical waveguides.

20 Claims, 22 Drawing Sheets

(51) Int. Cl.
  *H01S 5/028* (2006.01)
  *H01S 5/11* (2021.01)
  *H01S 5/02325* (2021.01)
  *H01S 5/042* (2006.01)
  *H01S 5/00* (2006.01)

(52) U.S. Cl.
  CPC .......... *H01S 5/0208* (2013.01); *H01S 5/0215* (2013.01); *H01S 5/0264* (2013.01); *H01S 5/0283* (2013.01); *H01S 5/04257* (2019.08); *H01S 5/11* (2021.01); *H01S 5/02325* (2021.01)

(58) Field of Classification Search
  CPC ....... H01S 5/0264; H01S 5/0215–0216; H01S 5/0201–0203; H01S 5/026–0268; H01S 5/021; H01L 23/544; H01L 2223/54426; H01L 2223/54453–54466
  See application file for complete search history.

(56) References Cited

U.S. PATENT DOCUMENTS

| | | | | |
|---|---|---|---|---|
| 2013/0015546 | A1* | 1/2013 | Joe | G02B 6/12002 257/432 |
| 2013/0189804 | A1* | 7/2013 | Marchena | H01L 21/76251 438/28 |
| 2013/0309801 | A1* | 11/2013 | Hsiao | H01L 24/94 438/65 |
| 2015/0010266 | A1* | 1/2015 | Webster | G02B 6/122 385/14 |
| 2015/0153524 | A1* | 6/2015 | Chen | G02B 6/4228 385/14 |
| 2017/0084595 | A1* | 3/2017 | Seddon | H01L 23/4951 |
| 2017/0139142 | A1* | 5/2017 | Patel | G02B 6/305 |
| 2017/0207600 | A1* | 7/2017 | Klamkin | G02B 6/12002 |

OTHER PUBLICATIONS

Wang et al., "1.3-?m InAs/GaAs quantum-dot lasers monolithically grown on Si substrates," 2011 Optical Society of America, 6 pages.

Norman et al, "Electrically pumped continuous wave quantum dot lasers epitaxially grown on patterned, on-axis (001) Si," Optics Express, vol. 25, No. 4, Feb. 20, 2017, 8 pages.

Liu et al., "Electrically Pumped Continuous-wave 1.3 quantum-dot lasers epitaxially grown on on-axis (001) GaP/Si," Dec. 12, 2016, Optics Letters, 6 pages.

Sacher, et al. "High-speed laser modulation beyond the relaxation resonance frequency limit" Mar. 22, 2010, Optics Express, vol. 18, No. 7, 8 pages.

* cited by examiner

LASER INTEGRATION INTO A SILICON PHOTONICS PLATFORM

CROSS-REFERENCE TO RELATED APPLICATIONS

The present application claims the benefit of Provisional Application Ser. No. 62/748,177 titled "LASER INTEGRATION INTO A SILICON PHOTONICS PLATFORM", filed 2018 Oct. 19, which is incorporated herein by reference in its entirety.

TECHNICAL FIELD

Embodiments presented in this disclosure generally relate to photonic integrated circuits. More specifically, embodiments disclosed herein related to the integration of laser elements into a silicon photonics platform.

BACKGROUND

Photonics platforms include several individually fabricated elements that are packaged together into a single optoelectronic element or circuit. For example, a laser element may be packaged together with another element that includes waveguides, thermal or electro-optic phase modulators, photodetectors, and chip-to-chip connectors that are formed in a separate die. The different processing steps used to individually form the different elements and join the different elements together can lead to back reflections, mismatched optical or material lattices between the elements, and processes that are time and material intensive.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1A:
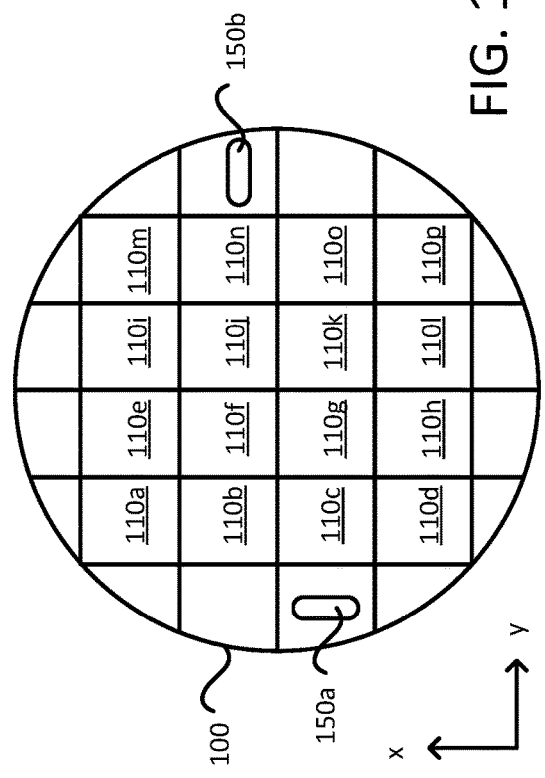
FIGS. 1A and 1B illustrate wafer-to-wafer bonding, according to embodiments of the present disclosure.

One embodiment presented in this disclosure provides for a method of laser integration into a photonic platform, the method comprising: forming, on a first substrate of a first wafer, a first plurality of dies that each includes: an active gain medium defined at a first height relative to the first substrate, a first insulator with a first face defined at a second height relative to the first substrate that is greater than the first height, and a first passive optical element aligned with the active gain medium and extending to the first face; forming, on a second substrate of a second wafer, a second plurality of dies corresponding to the first plurality of dies that each includes: a second insulator with a second face defined at a third height relative to the second substrate; and a second passive optical element defined at a fourth height relative to the second substrate that is less than the third height; bonding the first face of the first wafer to the second face of the second wafer such that the first passive optical element is vertically aligned with the second passive optical element; forming a plurality of contacts through the first insulator and the second insulator, wherein at least two contacts of the plurality of contacts are electrically connected across the active gain medium; and dicing the first wafer and the second wafer, as bonded, into a third plurality of silicon photonic platforms.

One embodiment presented in this disclosure provides for a photonics platform with an integrated laser, the photonic platform comprising: a first substrate; a III-V material joined to the first substrate and including an active gain medium; a first insulator disposed on the III-V material and including a first passive waveguide aligned to the active gain medium; and a second insulator including a second passive waveguide, wherein the second insulator contacts the first insulator along a wafer bonded interface that vertically aligns the second passive waveguide with the first passive waveguide.

One embodiment presented in this disclosure provides for a system, comprising: a first wafer, including a first substrate and a first insulator, the first insulator including a first plurality of dies that each include a first set of optical waveguides; a second wafer, including a second substrate and a second insulator, the second insulator including a second plurality of dies that each include a second set of optical waveguides; and a wafer bond interface joining the first insulator with the second insulator and vertically aligning the first plurality of dies with the second plurality of dies such that respective first sets of optical waveguides are optically coupled with respective second sets of optical waveguides.

Example Embodiments

The present disclosure provides for laser integration in Silicon Photonic platforms via components formed on multiple wafers that are later packaged into a combined photonic platform. An active gain medium, and related optical elements, are formed on a first wafer's medium and are combined with additional optical elements formed on a second wafer's medium. By using separate wafers to form the components of a combined photonic platform, a fabricator may use different processes to form the individual components. In various embodiments, the separate formation processes allow for one or more of: parallel component formation for greater fabrication speed, separate testing of components for lower scrap costs, individualized processing steps that allow for lower scrap rates and the use of mutually incompatible formation processes (e.g., avoiding cross-contamination during doping operations), wafer-level processing and packaging to reduce manual handling and scrap rates/costs, and other benefits.

Figure 1B:
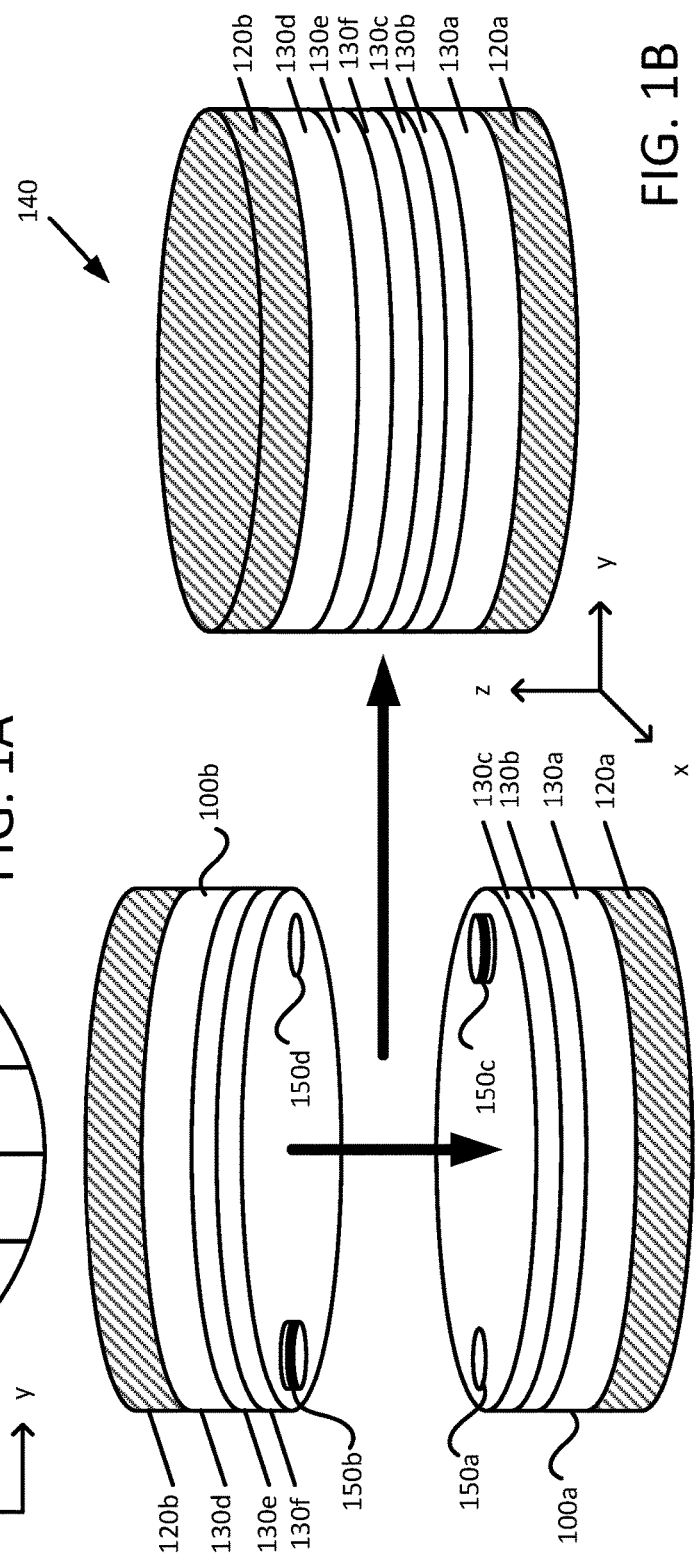

FIGS. 1A and 1B illustrate wafer-to-wafer bonding. FIG. 1A illustrates an example wafer 100 in a first plane of view that shows a plurality of dies 110a-p (generally, die 110) for individual components defined on a face of the wafer 100. FIG. 1B illustrates a first wafer 100a being bonded with a second wafer 110b in an isometric view that shows the respective substrates 120a,b (generally, substrate 120) and layers 130a-f (generally, layer 130) of the individual components defines on the respective wafers 100a,b. Each die 110 defines an instance of a component that has been formed on a substrate 120 of the wafer 100, and each component may be formed in layers 130 by various processes including epitaxial growth, vapor deposition, eutectic bonding, chemical or mechanical etching, etc. The various layers 130 define the various features and relative arrangements thereof of the components defined in the dies 110.

In various embodiments, a wafer 100 may include more or fewer than the sixteen dies 110 illustrated in FIG. 1A based on the relative sizes of the components defined by the dies 110 and the wafer 100 on which the components are formed. Similarly, each of the dies 110 may define components that are formed using more or fewer than the three layers 130 illustrated in profile in FIG. 1B.

The substrates 120 used in each of the wafer 100 bonded together may be made from Silicon (including Silicon Nitride (SiN) or Silicon Dioxide ($SiO_2$)) or a III-V material, such as, for example, Boron-Nitride (BN), Gallium-Nitride (GaN), GaAs (Gallium Arsenide), or InP (Indium Phosphide). In various embodiments, the matrix for the material used in a substrate 120 may be cut on-axis or off-axis relative to the crystalline structure of the substrate material, which varies the material lattice of the face of the substrate 120 available for growth of the additional layers 130 of Si or III-V materials. For example, an off-axis wafer 100 (i.e., a wafer 100 with a substrate 120 using an off-cut material) may provide a lower number of defects when forming a III-V material thereon than an on-axis wafer 100 (i.e., a wafer 100 with a substrate 120 using an on-cut material), but may require different processing techniques than providing an on-axis wafer 100. In various embodiments using an off-axis material, the off-cut is between 1 degree and 10 degrees from the material matrix axis, for example, an off-cut from the material matrix axis of the substrate of 6 degrees. The individual substrates 120a,b for bonded wafers 100a,b may be made of the same material of the same or different angles of cut, or may be made of different materials of the same or different angles of cut in various embodiments.

When bonding multiple wafers 100 together, such as first wafer 100a and second wafer 100b in FIG. 1B, the faces of the wafers 100 are aligned with one another so that the respective plurality of dies 110 defined in each wafer 100 mate with one another. By mating a first and a second plurality of dies 110 together that are formed from separate wafers 100, a fabricator may use different processes and materials (which may be otherwise incompatible with one another) to form the different layers 130 of a composite wafer 140 formed from two or more wafers 100.

In various embodiments, the faces of the wafers 100 that are to be bonded together include various alignment features 150 (e.g., wafer level alignment features) that are matched with alignment features 150 present on the other wafer 100.

For example, as illustrated in FIG. 1B, a first wafer 100a includes a first alignment feature 150a paired with a second alignment feature 150b included on the second wafer 100b, and a third alignment feature 150c paired with a fourth alignment feature 150d included on the second wafer 100b. Although two pairs of alignment features 150 are illustrated in FIG. 1B (which are presented as cylindrical depressions and projections), a wafer 100 may include more or fewer alignment features having various shapes and orientations in other embodiments. In some embodiments, the alignment features 150 are defined on a face of the wafer 100 in an area not occupied by the dies 110, such as the first alignment feature 150a and second alignment feature 150b illustrated in FIG. 1A, but in other embodiments, the dies 110 may include alignment feature 150.

FIGS. 2A-2I illustrate cross sections of a laser component 200 during formation. FIGS. 2A-2I may be understood in conjunction with FIG. 3, which is a flowchart of a method 300 for the formation of a laser component 200. Although the cross sections illustrated in FIGS. 2A-2I illustrate the formation of one component, as may be defined in one die 110, the formation of the laser component 200 may be performed on a wafer scale, thus producing the illustrated laser component 200 in several dies 110 on one wafer 100 in parallelized processes.

Figure 2A:
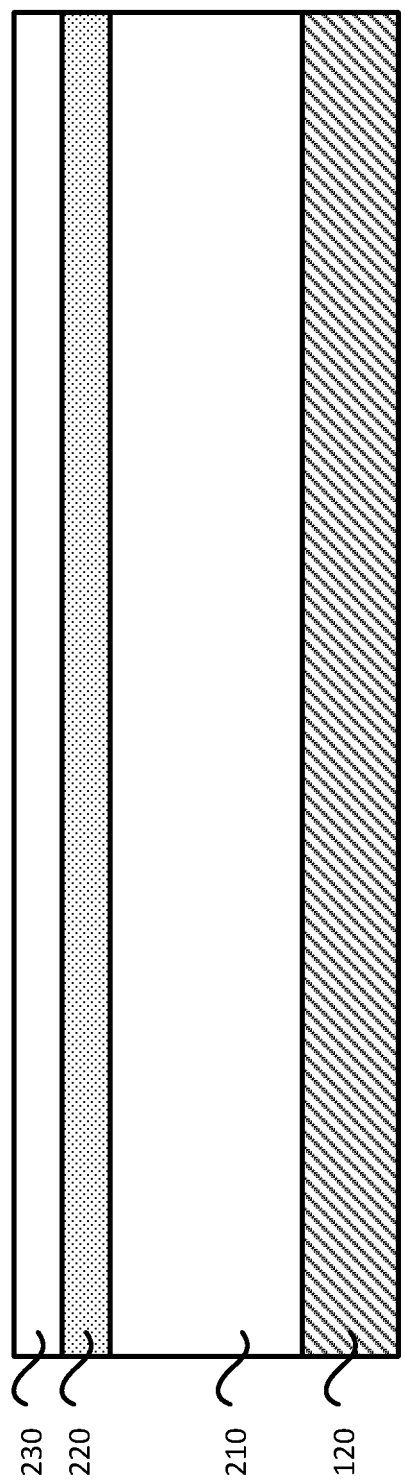
FIGS. 2A-2I illustrate cross sections of a laser element during formation, according to embodiments of the present disclosure.
Figure 3:
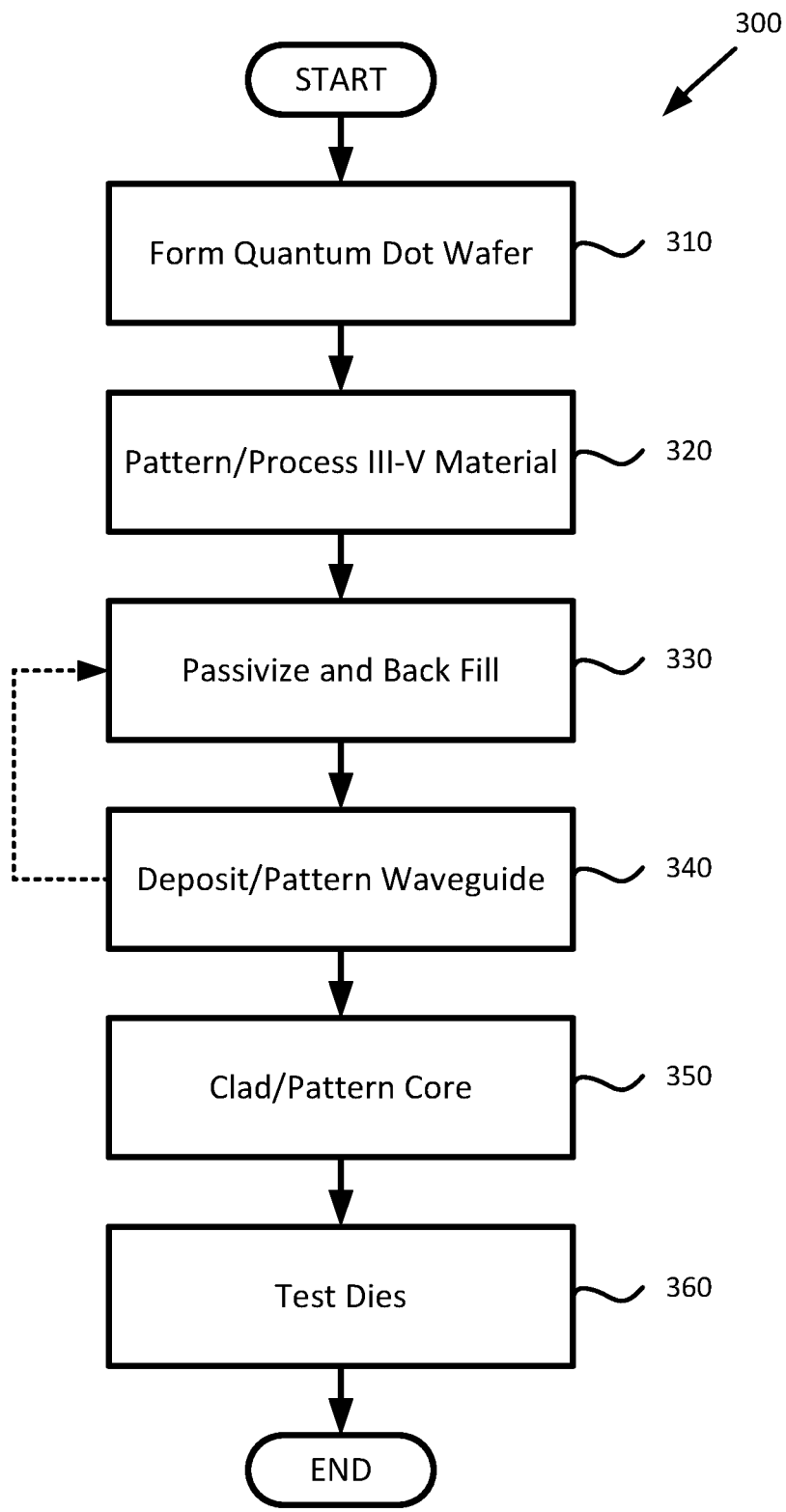
FIG. 3 is a flowchart of a method for forming a laser element, according to embodiments of the present disclosure.

FIG. 2A illustrates an initial cross section of a die 110 including a substrate 120 on which a first layer 210 of III-V material is deposited, from which an active gain medium 220 is formed in a III-V material, which is encapsulated by a second layer 230 of III-V material, forming a quantum dot wafer (per block 310. The III-V materials used in the various layers may include, but is not limited to: GaAs, GaN, GaSb, InSb, InAs, InP, etc.

The active gain medium 220 may include quantum dots, quantum wells or quantum wires, and bulk material. In some embodiments, the active gain medium 220 provides lasing or optical amplification when current is applied across the active gain medium 220. In some embodiments, the active gain medium 220 provides optical detection (e.g., as a light sensor) by producing a voltage difference when an external light source is applied to the active gain medium 220. The active gain medium 220 may include various layers of different cladding materials that are formed to surround the active gain medium 220 and provide a waveguide to amplify and direct light produced by the active gain medium 220. In some embodiments, a fabricator uses a III-V material in the cladding layers that is different than the III-V materials used in the active gain medium 220 or that includes different dopants.

Quantum dots and quantum wells are nano-structures that exhibit various properties, such as light generation in the presence of an applied electrical current, based on quantum mechanical effects. Quantum wells are two-dimensional structures formed by a thin layer of a first material surrounded by wider-bandgap material and that allow electronic capture in one dimension (allowing planar two-dimensional movement). In contrast, quantum dots act as zero-dimensional entities, which enables three-dimensional capture of excited electrons (not allowing movement). The quantum dots are surrounded by the waveguides of the cladding layers and are made of materials that have narrower bandgaps than the material of the cladding layers. As will be appreciated, the precise size, shape, and material of the quantum dots or wells affect the color of coherent light produced by the laser.

Figure 2B:
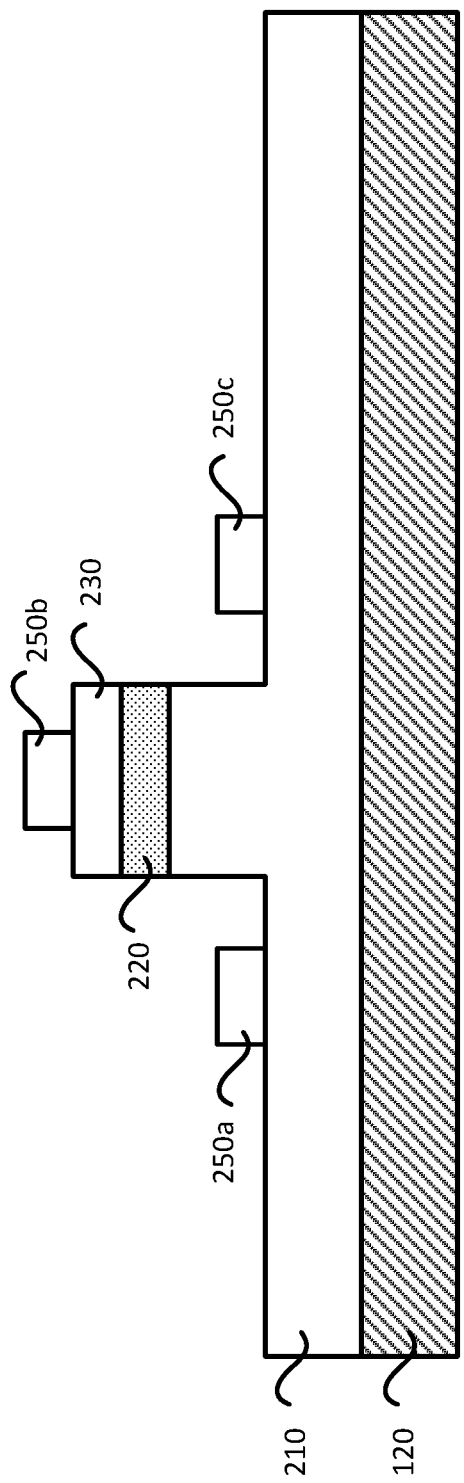

FIG. 2B illustrates the cross-sectioned die 110 of FIG. 2A as patterned and processed by a fabricator (per block 320).

A fabricator may etch the layers of III-V materials included on the wafer 100 to define several components in the various dies 110 defined in the wafer 100 using various mechanical or chemical etching processes. As illustrated, the fabricator etches the second layer 230, the active gain medium 220, and the first layer 210 into a desired cross-sectional shape, which exposes the active gain medium 220. Additionally, the fabricator uses one or more metallization steps to form the first layer 210 and the second layer 220 as contacts 250a-c (generally, contacts 250) through which electrical contact may be made across the active gain medium 220. Additionally, the fabricator may polish or apply optical coatings to the exposed faces of the active gain medium 220 to affect the optical properties of various faces of the active gain medium 220.

Figure 2C:
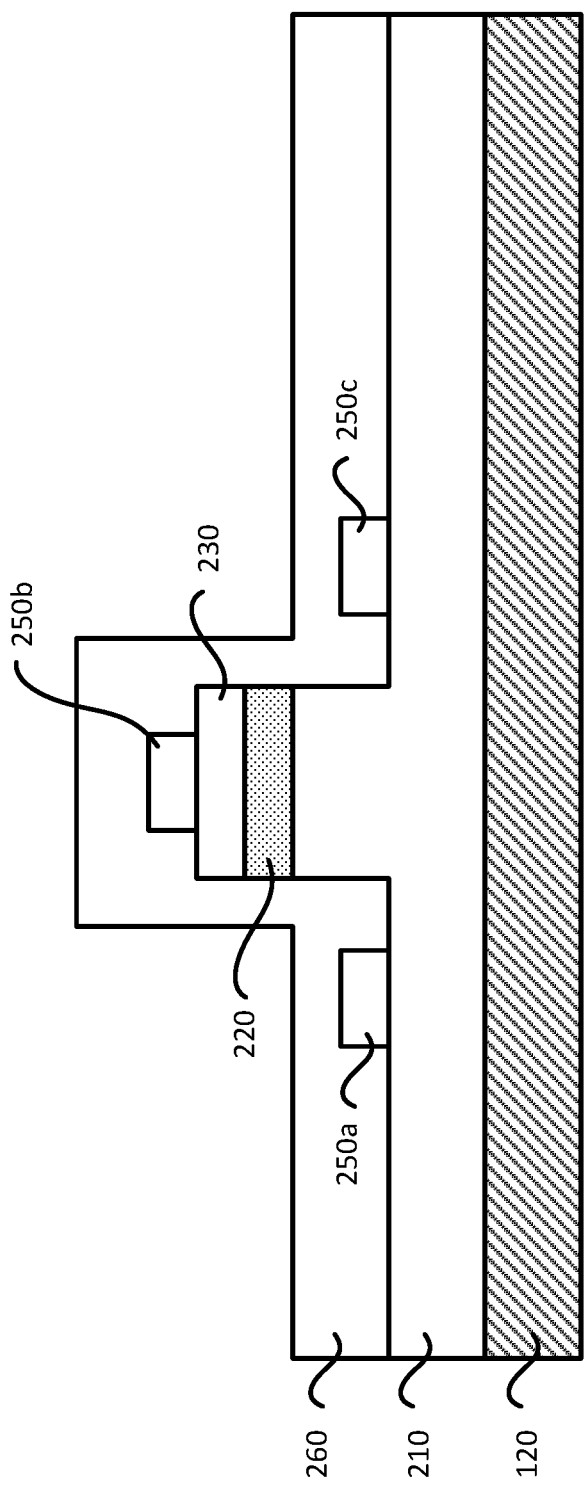

FIG. 2C illustrates the cross-sectioned die 110 of FIG. 2B which has been passivized and backfilled by a fabricator (per block 330). A fabricator may apply an insulator 260, such as SiO₂ or SiN, at various heights/thicknesses to position later-applied optical or physical elements of the component.

Figure 2D:
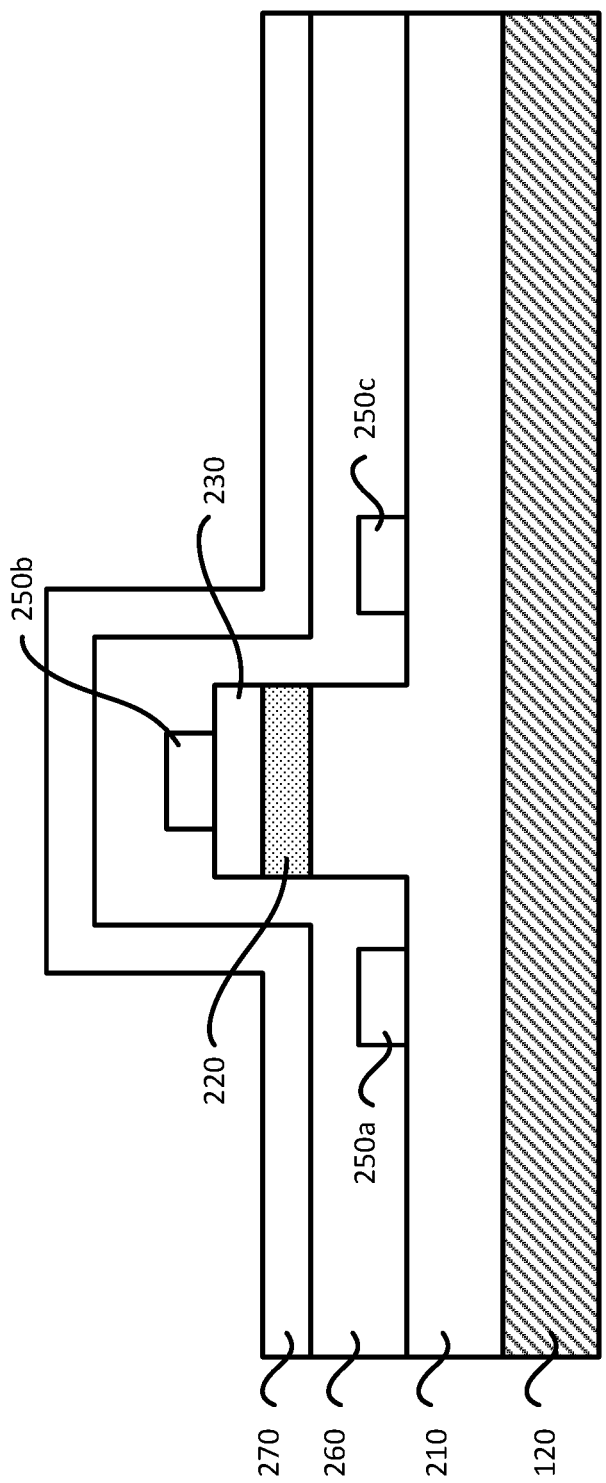

FIG. 2D illustrates the cross-sectioned die 110 of FIG. 2C with an optical layer 270 deposited (per block 340) on the insulator 260. The optical layer 270 may be made of various materials, such as Silicon Nitride, that provide a path for light of a given wavelength to travel through. In various embodiments, the optical layer 270 includes various splitters, modulators, routing, etc., to manipulate the properties of the light traveling thereon.

Figure 2E:
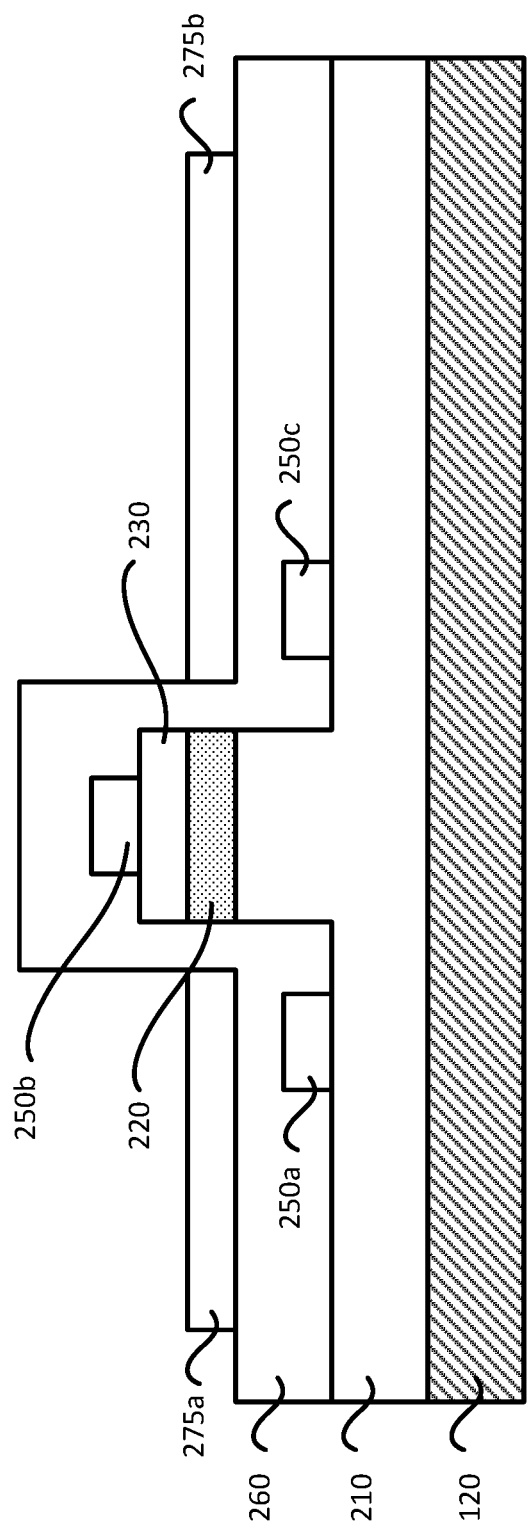

FIG. 2E illustrates the cross-sectioned die 110 of FIG. 2D with the optical layer 270 patterned into individual waveguides 275a,b (generally, waveguide 275) (per block 340). The waveguides 275 are shaped from the optical layer 270 using various mechanical or chemical etching processes to produce a desired three-dimensional shape for the waveguides 275. For example, the illustrated waveguides 275 are shown as having cross-sectional shapes configured for butt-coupling, but a fabricator may process the waveguides 275 to include prong couplers, tapered couplers, or evanescent couplers, such as, adiabatic or directional couplers, in various embodiments.

Figure 2F:
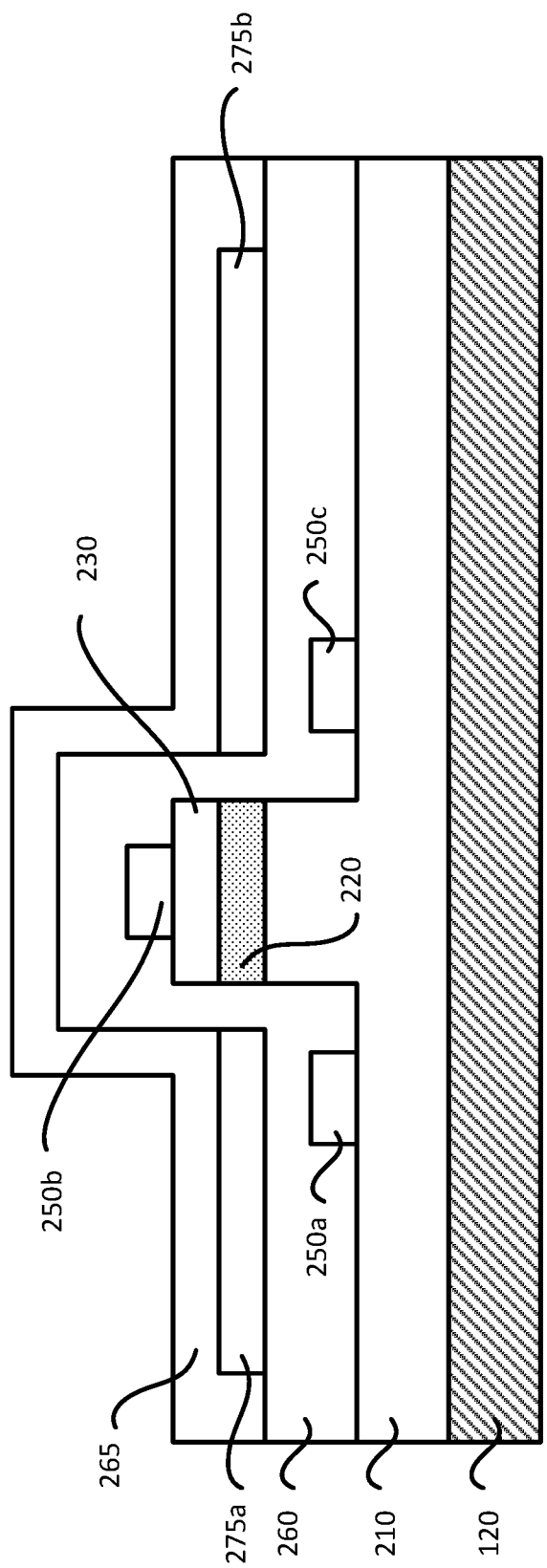

FIG. 2F illustrates the cross-sectioned die 110 of FIG. 2E with an additional insulator layer 265 applied to the waveguides 275 to passivize and backfill components defined on the dies 110 (per block 330). The additional insulator layer 265 may be the same material as the insulator 260 applied per block 330 or a different material, and provides an interstitial layer that a fabricator applies additional optical or physical elements to.

Figure 2G:
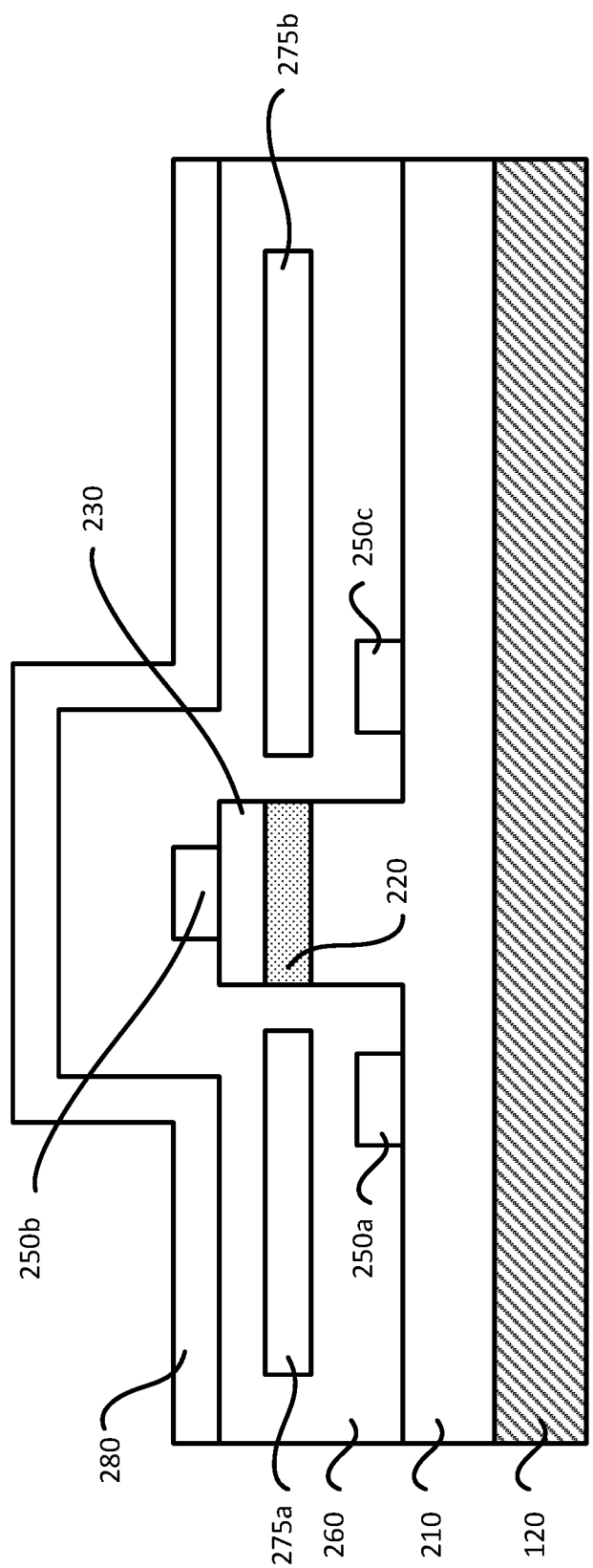

FIG. 2G illustrates the cross-sectioned die 110 of FIG. 2F with an additional optical layer 280 applied over the insulator 260 (per block 340).

Figure 2H:
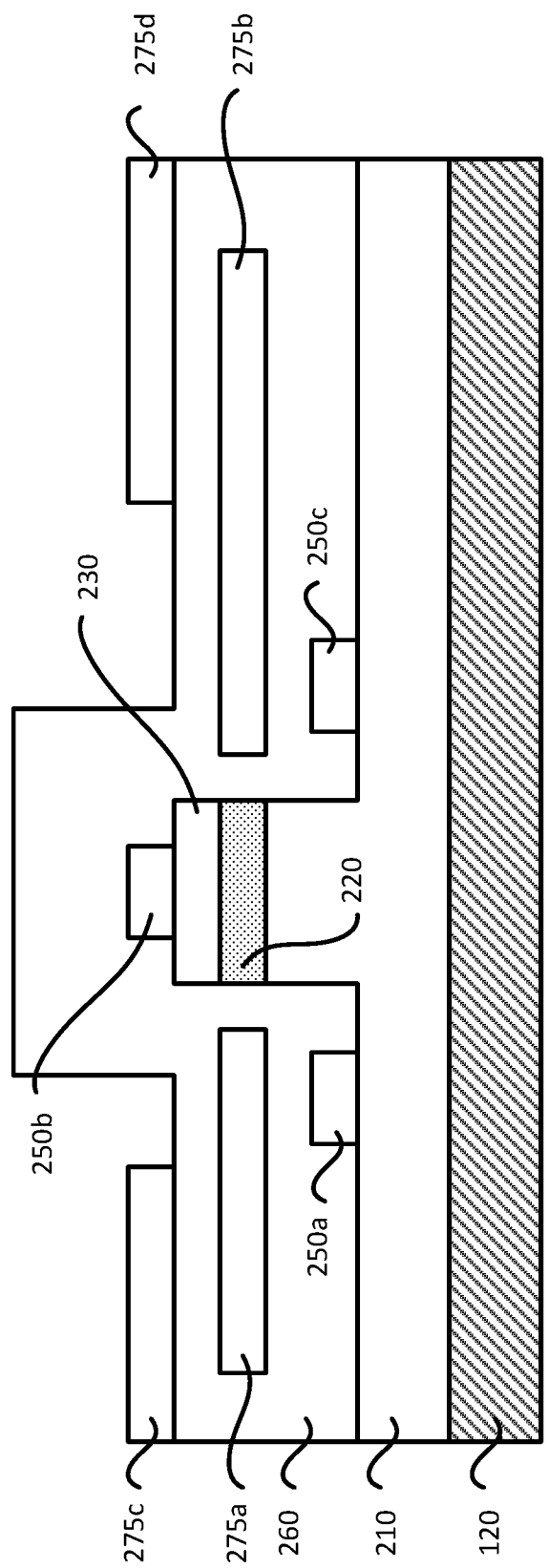

FIG. 2H illustrates the cross-sectioned die 110 of FIG. 2G in which the additional optical layer 280 is patterned into individual waveguides 275c,d. A fabricator may apply several layers of optical material at different heights and locations within the applied layers of the insulator 260 to define an optical pathway for light to travel into or out of the active gain medium 220, cycling through blocks 330 and 340 of method 300 until the components defined on the dies 110 reach a desired layout.

Figure 2I:
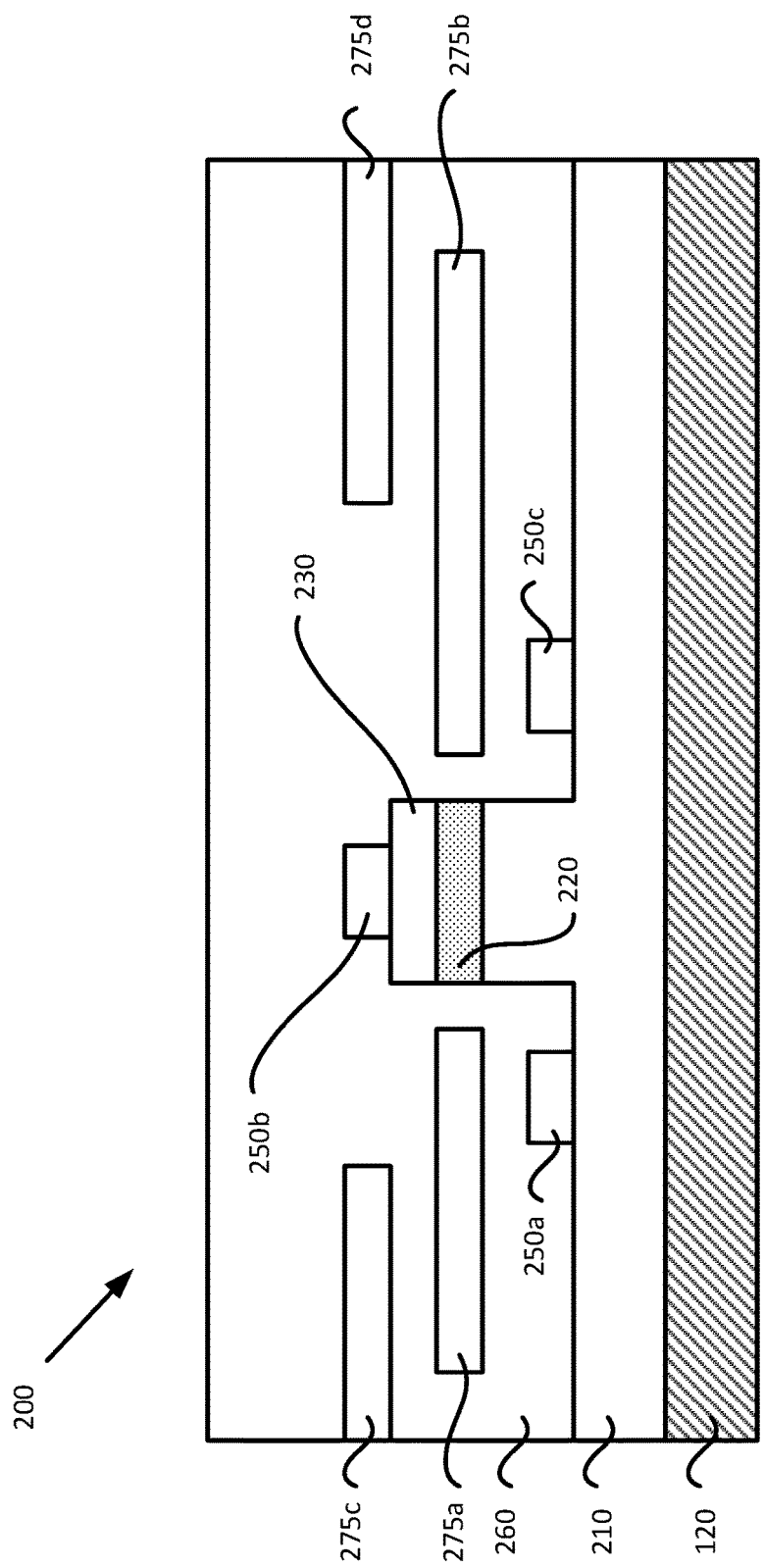
Figure 7:
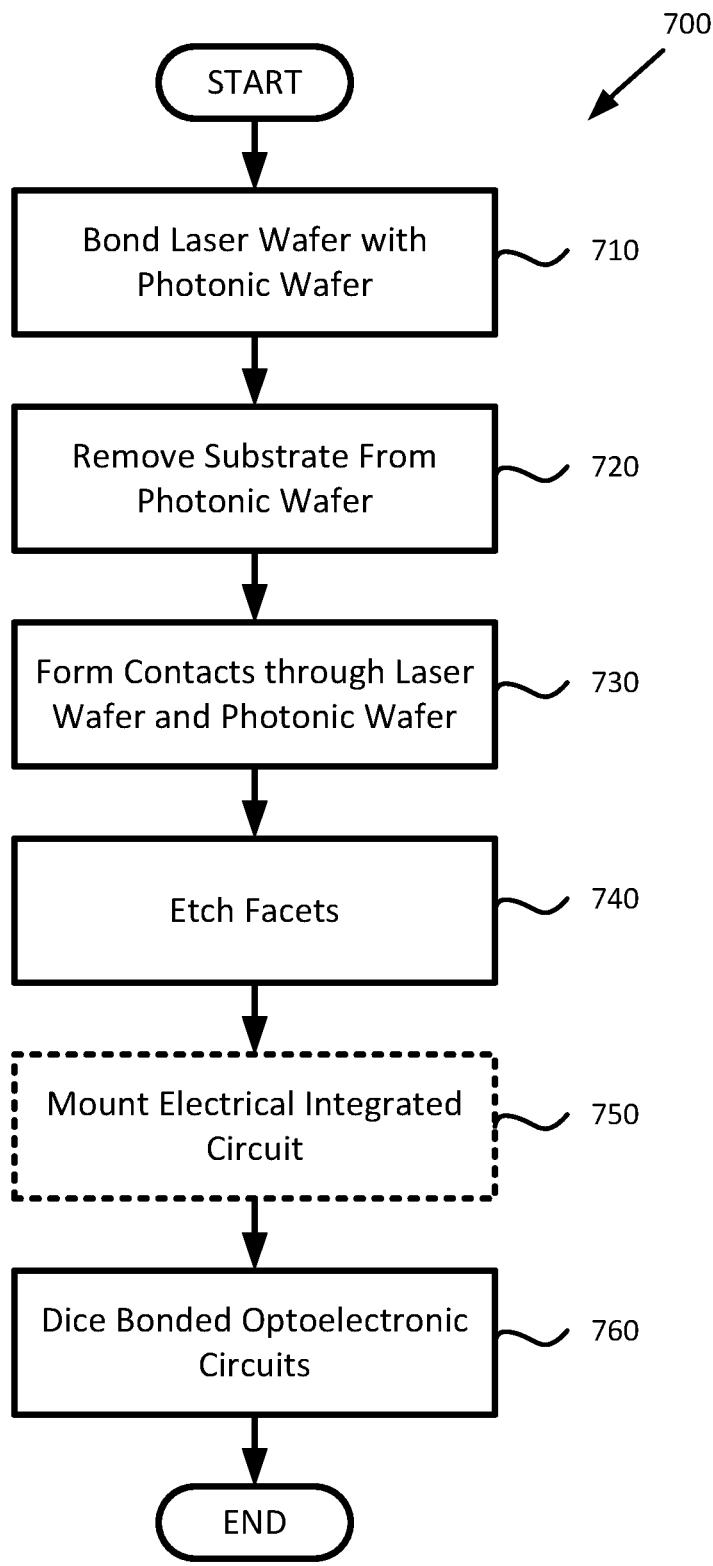
FIG. 7 is a flowchart of a method for packaging an optoelectronic circuit, according to embodiments of the present disclosure.

FIG. 2I illustrates the cross-sectioned die 110 of FIG. 2H in which the core of the component is clad with additional insulative material and patterned (per block 350). The fabricator adds to the insulator 260 to encapsulate the elements in the die 110, and shapes, patterns, and polishes the outer surface of the insulator 260 to provide an outer layer for bonding to and optical coupling with another wafer 100 (e.g., per method 700 discussed in relation to FIG. 7).

FIGS. 2A-2I provide one example of a layout of a laser component 200, and a fabricator may apply method 300 to produce other laser components 200 having different internal elements and arrangements thereof in other embodiments.

Once the laser component 200 is complete, the fabricator may perform wafer-level tests on the dies 110 in the wafer (per block 360) to determine which dies 110 define components that conform to various test criteria, and which are noncompliant.

FIGS. 4A-4E illustrate cross sections of an optical component 400 during formation. FIGS. 4A-4E may be understood in conjunction with FIG. 5, which is a flowchart of a method 500 for the formation of an optical component 400. Although the cross sections illustrated in FIGS. 4A-4E illustrate the formation of one component, as may be defined in one die 110, the formation of the optical component 400 may be performed on a wafer scale, thus producing the illustrated optical component 400 in several dies 110 on one wafer 100 in parallelized processes. The optical components 400 are formed on a different wafer 100 than the laser components 200 discussed in relation to FIGS. 2A-2I and 3, and may be formed at the same time or at a different time in anticipation of bonding the optical components 400 with the laser components 200 (as discussed in greater detail in regard to FIGS. 6A-6D and 7).

Figure 4A:
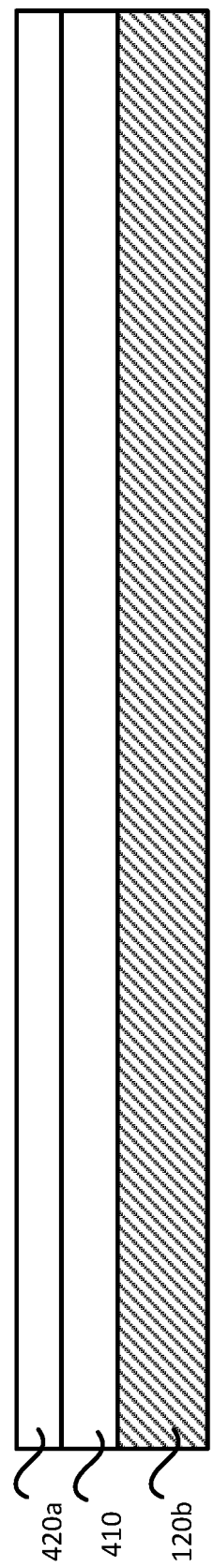
FIGS. 4A-4E illustrate cross sections of a photonic element during formation, according to embodiments of the present disclosure.
Figure 5:
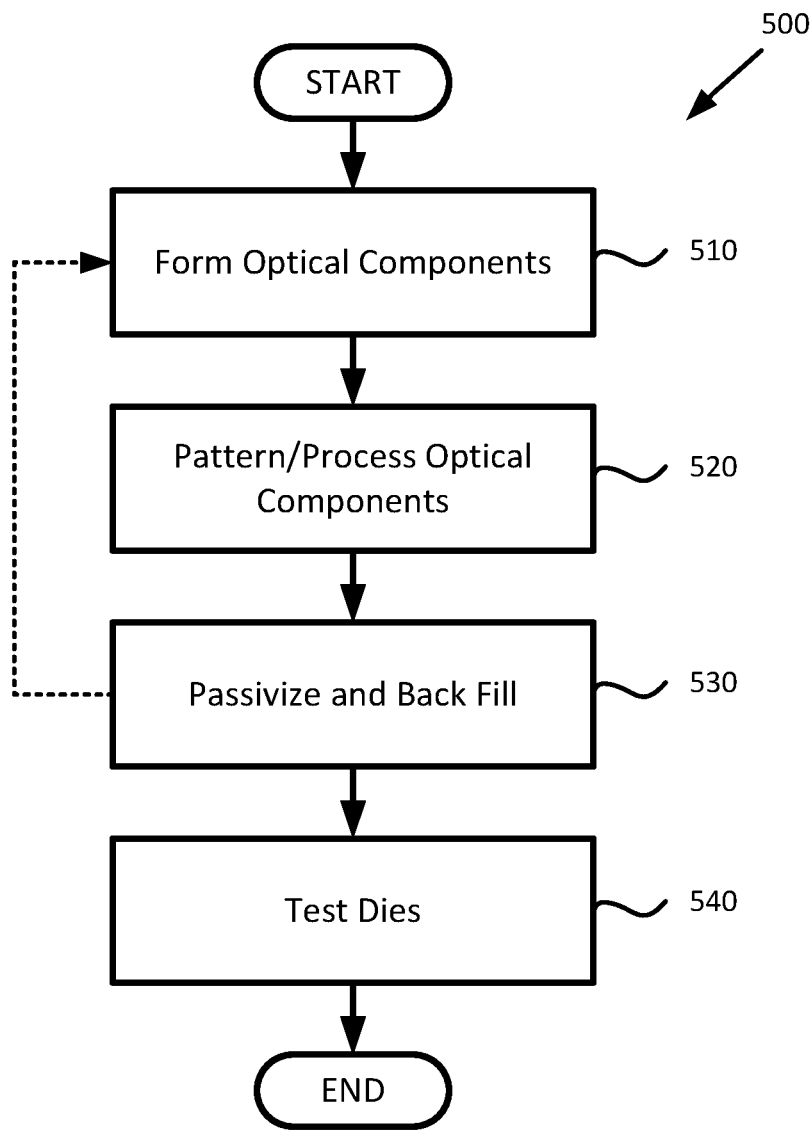
FIG. 5 is a flowchart of a method for forming a photonic element, according to embodiments of the present disclosure.

FIG. 4A illustrates an initial cross section of a die 110 of a second substrate 120b on which a first optical insulator layer 410 is deposited, from which a first optical element layer 420a (generally optical element layer 420) is formed (per block 510). The fabricator applies the optical insulator layer 410, which may include SiO₂ or SiN, at various heights/thicknesses to position later-applied optical or physical elements of the component. The first optical element layer 420a may include various splitters, modulators, routing, waveguides, photodetectors, etc. that are defined at a given height from the second substrate 120b.

Figure 4B:
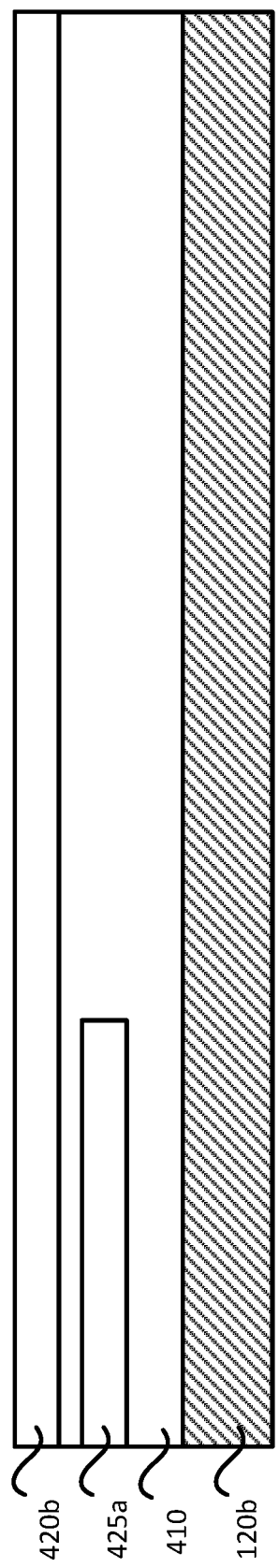

FIG. 4B illustrates the cross-sectioned die 110 from FIG. 4A in which the fabricator has patterned the first optical element layer 420a into a first optical element 425a (generally, optical element 425) (per block 520), applied additional insulative material to encapsulate, passivize, and back-fill the first optical element 425a in the optical insulator layer 410 (per block 530), and formed a second optical element layer 420b (per block 510). A fabricator may apply several optical element layers 420, pattern those layers into discrete optical elements 425, and encapsulate those optical elements 425 into the optical insulator 410 over several stages until a final optical component 400 is created.

Figure 4C:
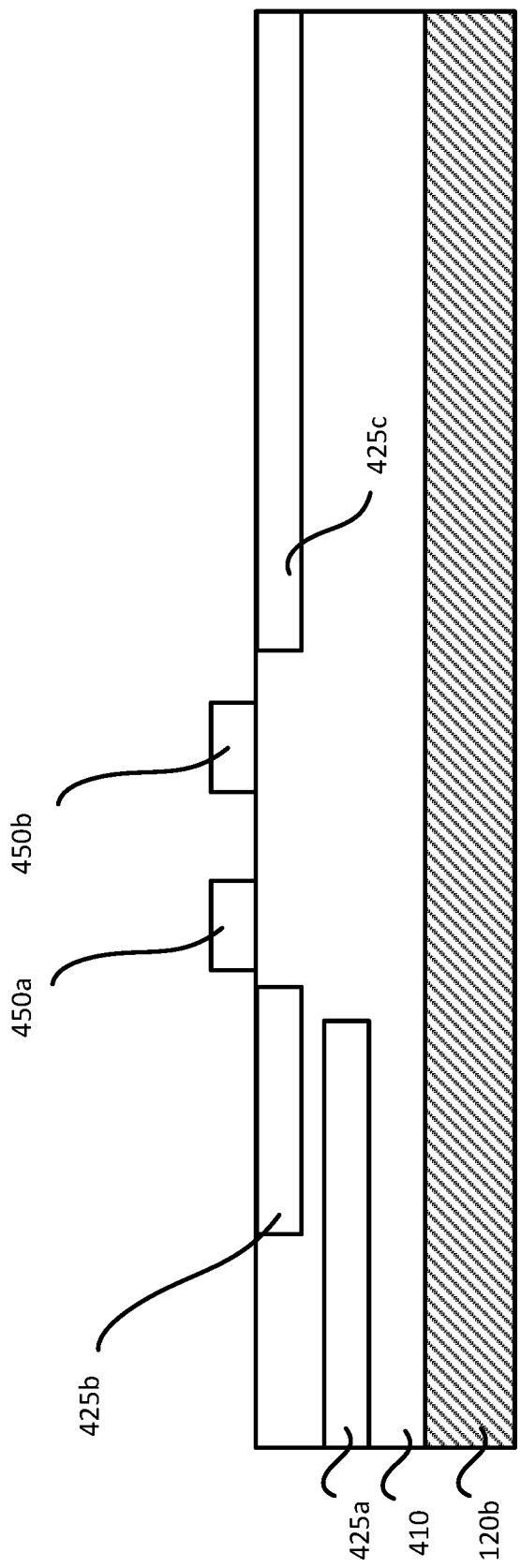

FIG. 4C illustrates the cross-sectioned die 110 from FIG. 4B in which the fabricator has patterned the second optical element layer 420b into a second optical element 425b and a third optical element 425c (per block 520), has applied additional insulative material to encapsulate the second and third optical elements 425b,c in the optical insulator layer 410 (per block 530), and has formed a first electrical contact 450a (generally, electrical contact 450) and a second electrical contact 450b on the optical insulator 410. The electrical contacts 450 may be formed at various positions in the insulator 460 to provide for electrical connections to be established at various portions of the optical component 400. In various embodiments, the discrete optical elements 425 formed from different optical element layers 420 may be of the same or of different types. For example, the first optical element 425a may be a photodetector (e.g., a light sensor) whereas the second and fourth optical elements 425b,d may be waveguides.

Figure 4D:
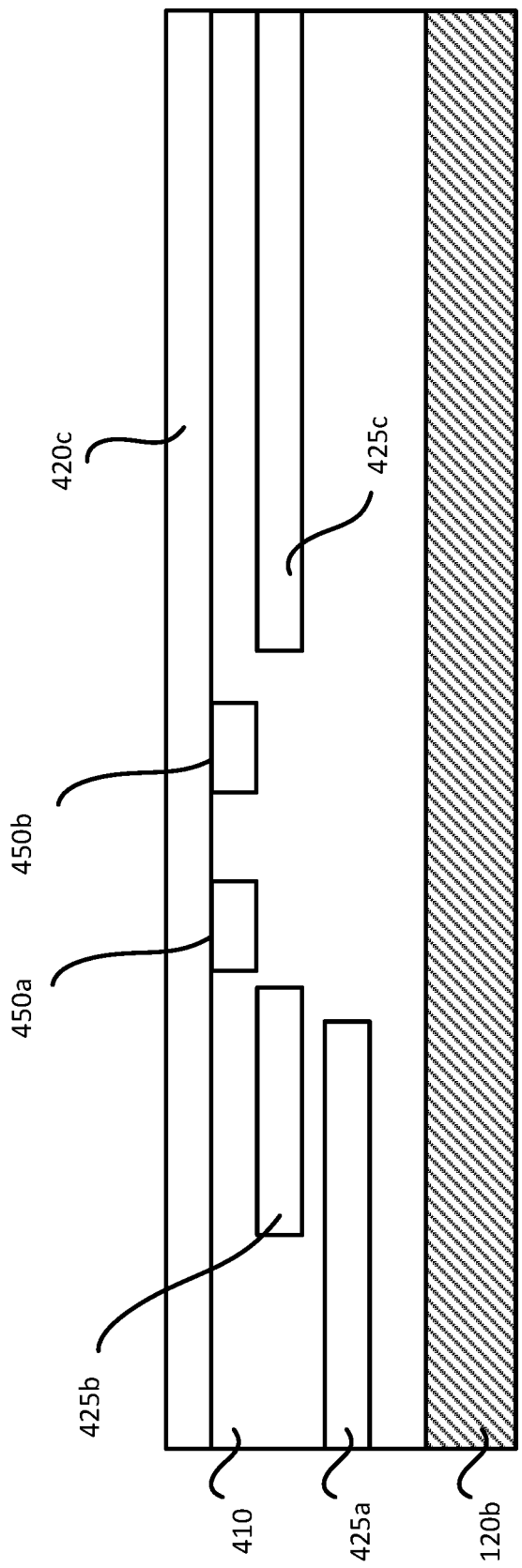

FIG. 4D illustrates the cross-sectioned die 110 from FIG. 4C in which the fabricator has applied additional insulative material to encapsulate the first and second electrical contacts 450a,b in the optical insulator layer 410 (per block 530) and has formed a third optical element layer 420c (per block 510) on the optical insulator 410.

Figure 4E:
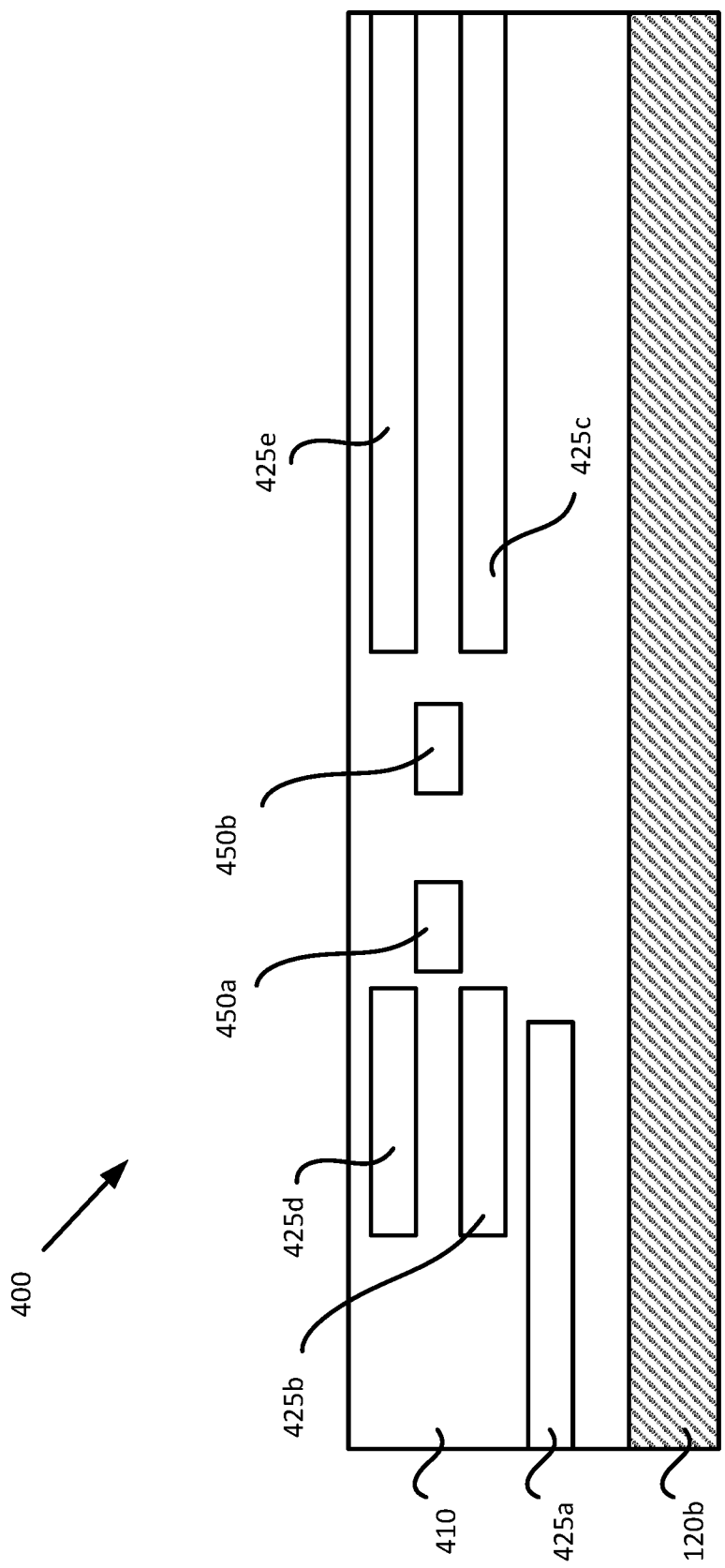

FIG. 4E illustrates the cross-sectioned die 110 from FIG. 4D in which the fabricator has patterned the third optical element layer 420c into a fourth optical element 425d and a fifth optical element 425e (per block 520) and applied additional insulative material to encapsulate the first and second electrical contacts 450a,b in the optical insulator layer 410 (per block 530) and produce the finalized optical component 400. The uppermost optical elements 425, relative to the second substrate 120b, are designed to form an optical pathway between the finalized optical component 400 and may include a grating coupler to selectively communicate various wavelengths of light between the finalized optical component 400 and a finalized laser component 200 when joined in a composite wafer 140 or individual silicon photonic platforms formed from the composite wafer 140.

FIGS. 4A-4E provide one example of a layout of an optical component 400, and a fabricator may apply method 500 to produce other optical components 400 having different internal elements and arrangements thereof in other embodiments.

Once the optical component 400 is complete, the fabricator may perform wafer-level tests on the dies 110 in the wafer (per block 540) to determine which dies 110 define components that conform to various test criteria, and which are noncompliant.

FIGS. 6A-6D illustrate cross sections of a photonic platform 670 during packaging. FIGS. 6A-6D may be understood in conjunction with FIG. 7, which is a flowchart of a method 700 for the packaging of a photonic platform 670. The illustrated examples in FIGS. 6A-6D use the laser component 200 discussed in relation to FIGS. 2A-2I and 3 and the optical component 400 discussed in relation to FIGS. 4A-E and 5, but other embodiments may use different components arranged with different elements defined therein. Although the cross sections illustrated in FIGS. 6A-6D illustrate the packaging of one component, as may be defined in one set of paired dies 110, the packaging of the photonic platform 670 may be performed on a wafer scale, thus producing the optoelectronic circuit illustrated as the photonic platform 670 in several paired dies 110 on one composite wafer 140 in parallelized processes.

Figure 6A:
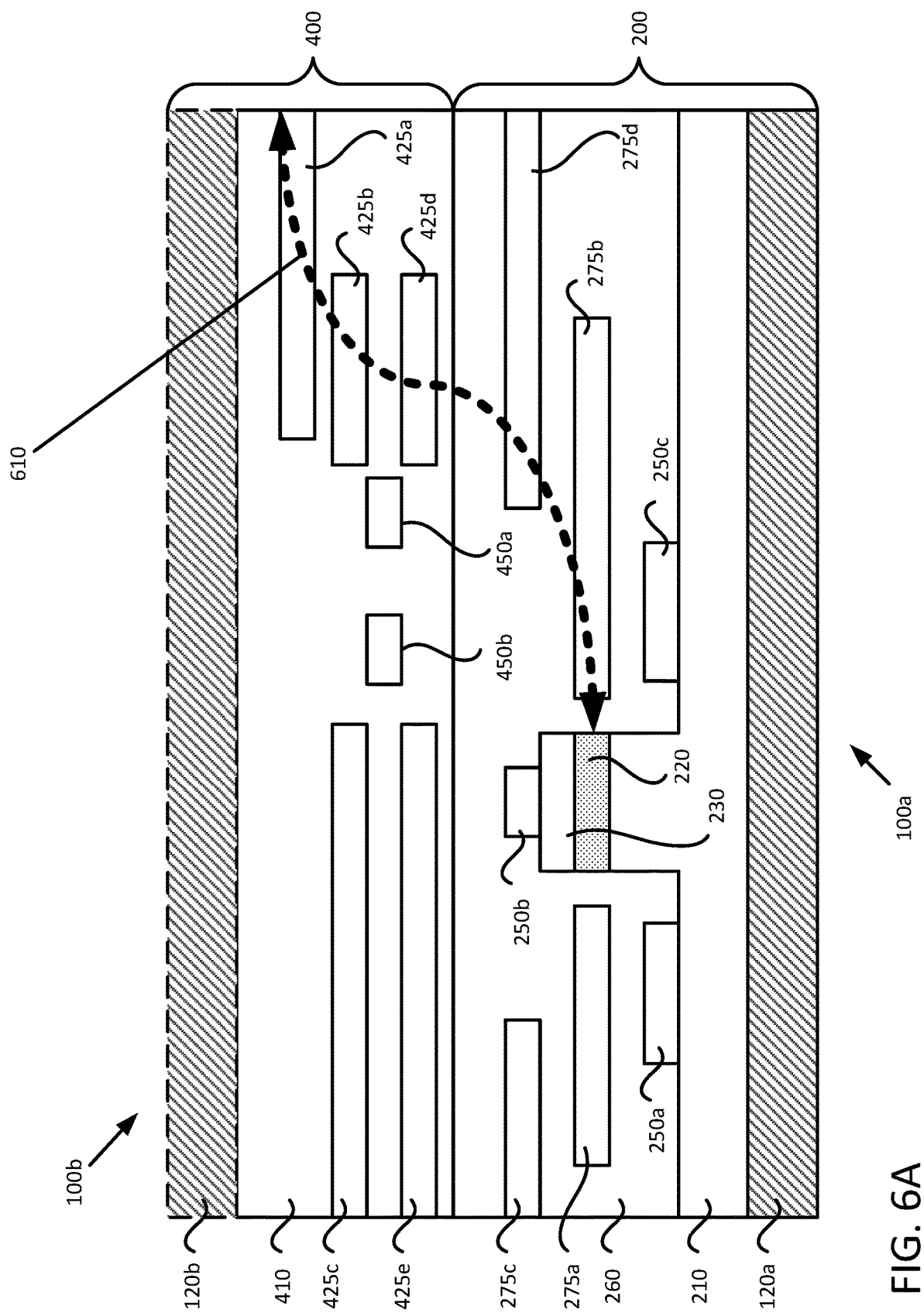
FIGS. 6A-6D illustrate cross sections of an optoelectronic circuit during packaging, according to embodiments of the present disclosure.

FIG. 6A illustrates a die-to-die bond between a laser component 200 defined in the dies 110 of a first wafer 100a (e.g., a laser wafer) with an optical component 400 defined in the dies 110 of a second wafer 100b (e.g., a photonic wafer) (per block 710). A bond interface is formed between the insulator 260 of the first wafer 100a and the optical insulator 410 of the second wafer 100b via oxide-to-oxide bonding techniques, which may include plasma assisted bonding.

Various alignment features 150 (not shown in FIGS. 6A-6D) defined on the surfaces of the wafers 100 that are to be bonded align the various dies 110 of the wafers 100 to ensure that an optical pathway 610 is formed that runs from the active gain medium 220, through the waveguides 275 in the laser component 200, and into the optical elements 425 of the optical component 400 (including waveguides, detectors, modulators, phase shifters, etc.). The optical pathway 610 between the laser component 200 and the optical component 400 may be established via various evanescent connections and may include a grating coupler or a wavelength filter to selectively allow light of a certain bandwidth to pass between the laser component 200 and the optical component 400. For example, the optical pathway 610 illustrated in FIG. 6A is defined through a first set of optical waveguides 275 in the laser component 200 (e.g., optical waveguides 275b and 275d) that are optically coupled with the active gain medium 220 at a first height (relative to the first substrate 120a), and run for a first distance away from the active gain medium to a second height (relative to the first substrate 120a). The optical pathway 610 is defined through a second set of waveguides in the optical component 400 (e.g., optical elements 425b and 425d) to travel from the interface to a third height (relative to the first substrate 120a) and a second distance relative to the active gain medium 220 to thereby optically couple a photodetector or light sensor (e.g., optical element 425a) with the active gain medium via the first and second sets of optical waveguides.

As illustrated in the examples shown in FIGS. 6A-6D, the second substrate 120b of the second wafer 100b is optionally removed from the composite wafer 140 at block 720 of method 700, although in some aspects, the second substrate 120b may be retained in full or as a thinned layer. A fabricator may remove the second substrate 120b by one or more of a physical or chemical etching process that leaves a second face of the optical insulator layer 410 patterned and available for bonding with another wafer 100 (e.g., a third wafer 100) or another circuit.

Figure 6B:
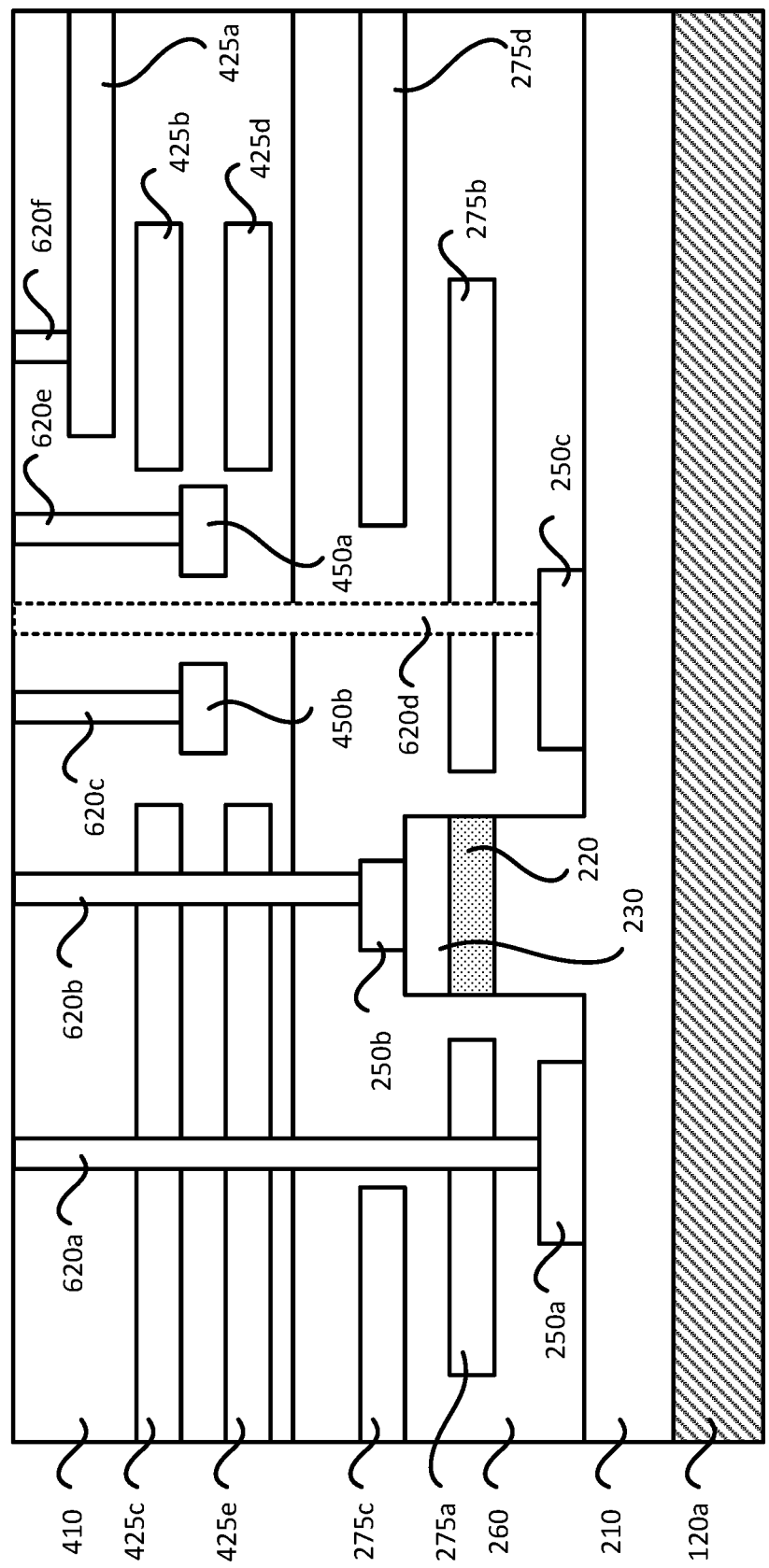

FIG. 6B illustrates the metallization of the bonded laser component 200 and optical component 400 (as per block 730). The fabricator forms various traces 620a-f (generally, traces 620) through the optical insulator 410 and/or the insulator 260 to connect with the contacts 250 formed in the laser component 200 and the electrical contacts 450 formed in the optical component 400. As illustrated, the traces 620 may be formed in various planes that pass through, avoid, or contact the waveguides 275, optical elements 425, contacts 250, and electrical contacts 450. For example, the fourth trace 620d is shown in dashed lines to indicate that the fourth trace 620d is defined in a different plane than the cross-sections illustrated in FIGS. 6B-6D so as to not interfere with the second waveguide 275b. In another example, the sixth trace 620f is in electrical communication with the first optical element 425a, which is a photodetector or other light sensor in some embodiments, and is shown in solid lines to indicate that the sixth trace 620f is defined in the same plane used in the cross-sections illustrated in FIGS. 6B-6D.

Figure 6C:
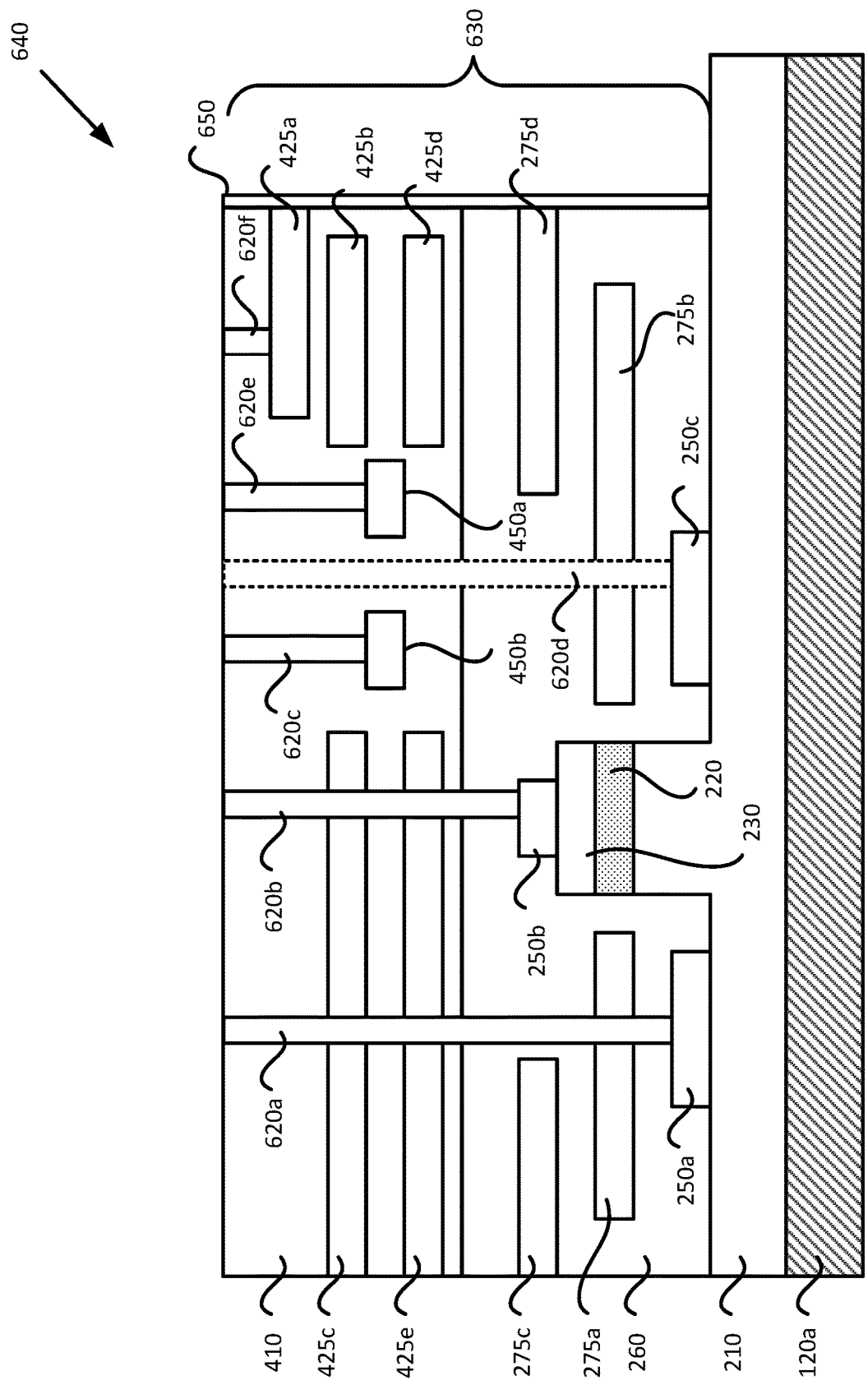

FIG. 6C illustrates the bonded laser component 200 and optical component 400 with a new facet 630 (as per block 740) to produce a faceted combined component 640. The fabricator may etch a new facet 630 by various physical and chemical processes to expose portions of the waveguides 275 and optical elements 425 on a face perpendicular to the substrate(s) 120. The facet 630 allows for the internal features of the bonded laser component 200 and optical component 400 to be optically (or electrically) coupled with the features of an external chip or other photonic platform via butt coupling mechanisms. In some embodiments, the fabricator polishes the facet 630 or applies an Optical Coupling Interface (OCI) coating (e.g., a layer of SiN, $Ta_2O_5$, $TiO_2$) to affect the reflective and refractive properties of the facet 630.

Figure 6D:
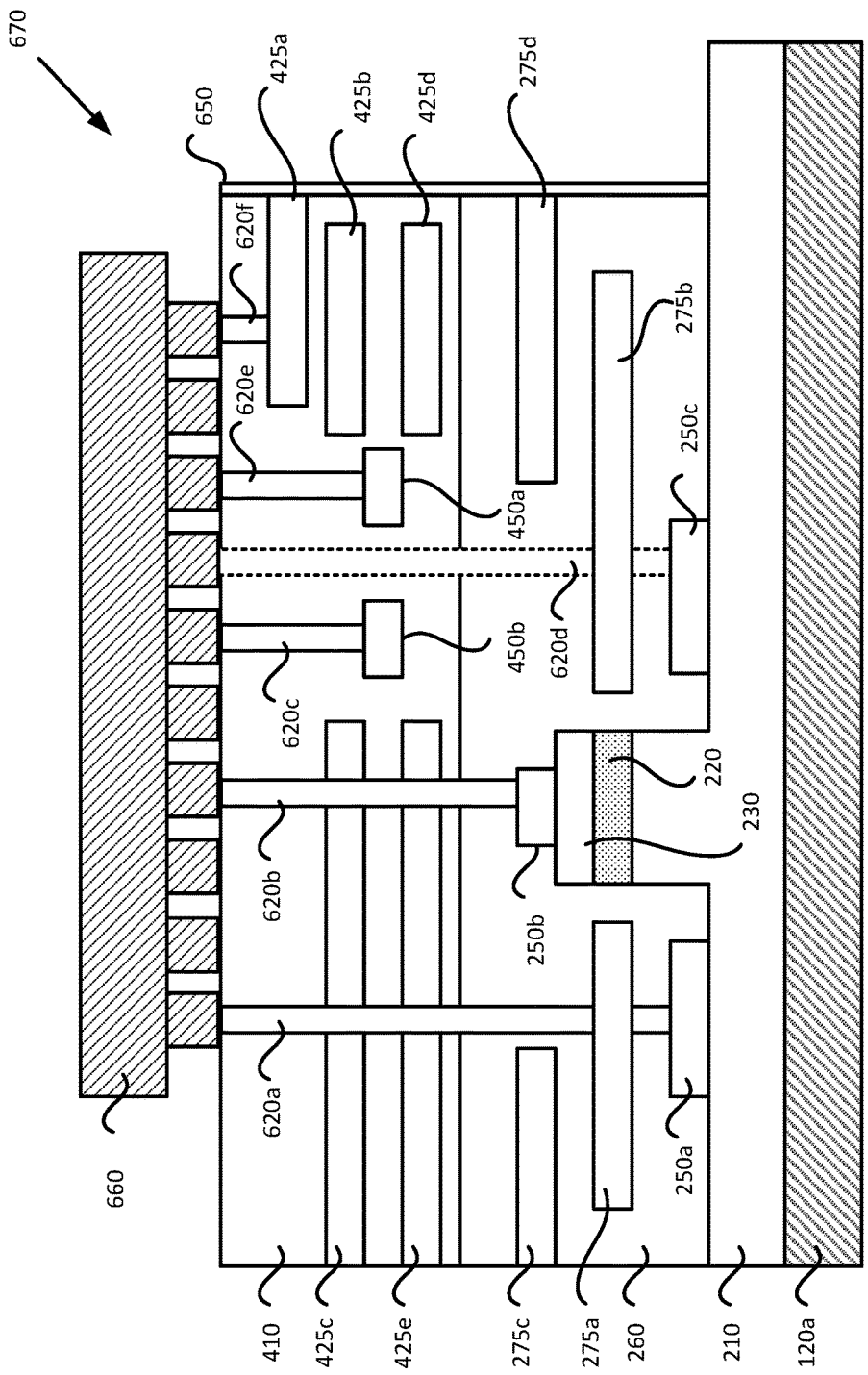

FIG. 6D illustrates the mounting of an Electrical Integrated Circuit (EIC) 660 (per block 750) to produce a photonic platform 670 from the faceted combined component 640. A fabricator may mount the connectors of the EIC 660 via various solders or interconnects to the traces 620 defined in the faceted combined component 640. In various embodiments, some or all of the connectors of the EIC 660 are connected to the mounting pads of the traces 620 defined on the second substrate 120b (if retained) or the exposed upper surface of the optical insulator layer 410 (if the second substrate 120b is removed).

At block 760, the fabricator dices/cleaves the composite wafer 140 into individual photonics platforms 670 according to each bonded pair of dies 110. The fabricator may then test the individual photonics platforms 670.

In various embodiments, because the fabricator has tested the laser component 200 and the optical component 400 separately from one another prior to bonding the respective wafers 100, the fabricator may skip performing further processing (such as one or more of blocks 730-760 of method 700) on portions of the composite wafer 140 in which one or both dies 110 were found to be non-compliant. Stated differently, the fabricator may process only the bonded pairs of dies 110 (per one or more of blocks 730-760 of method 700) in which both the laser component 200 and the optical component 400 thereof have passed an earlier test phase. For example, in a given pair of dies 110 in a composite wafer 140 in which one or both of the laser component 200 and the optical component 400 was found to be noncompliant during test (e.g., during block 360 of method 300 or block 540 of method 500), the fabricator may forego forming traces 620, etching a facet 630, applying an optical coating 650, or mounting an EIC 660. In some embodiments, the fabricator may perform additional tests on the finalized photonic platform 670 to ensure that the photonic platform 670 conforms to various test criteria.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:
1. A method, comprising:
forming, on a first substrate of a first wafer, a first plurality of dies, wherein each die of the first plurality of dies includes:
a first layer of III-V material extending across the first substrate at a first thickness in a first region and in a second thickness greater than the first thickness in a second region;
an active gain medium defined in the second region of the first layer of III-V material at a first height relative to the first substrate,
a first insulator with a first face defined at a second height relative to the first substrate that is greater than the first height, and
a first passive optical element aligned with the active gain medium and extending to the first face;
forming, on a second substrate of a second wafer, a second plurality of dies corresponding to the first plurality of dies, wherein each die of the second plurality of dies includes:
a second insulator with a second face defined at a third height relative to the second substrate; and
a second passive optical element defined at a fourth height relative to the second substrate that is less than the third height;
bonding the first face to the second face such that the first passive optical element is vertically aligned with the second passive optical element to form an evanescent connection between the first passive optical element and the second passive optical element;
forming a plurality of contacts through the first insulator and the second insulator, wherein at least two contacts of the plurality of contacts are electrically connected across the active gain medium; and
dicing the first wafer and the second wafer, as bonded, into a plurality of silicon photonic platforms.
2. The method of claim 1, further comprising:
etching a facet into the first wafer and the second wafer in a plane perpendicular to the first face and the second face in the first direction from the active gain medium.

3. The method of claim 2, further comprising:
applying an optical coating to at least a portion of the facet aligned with an optical component exposed from a die included in at least one of the first plurality of dies and the second plurality of dies.

4. The method of claim 1, further comprising:
after bonding the first face to the second face, removing the second substrate from the second wafer.

5. The method of claim 1, wherein forming the first plurality of dies and forming the second plurality of dies further comprises:
testing the first plurality of dies; and
testing the second plurality of dies, wherein the second plurality of dies is tested separately from the first plurality of dies.

6. The method of claim 1, further comprising:
forming a first alignment feature on the first wafer, wherein the first alignment feature is included in a first area of the first wafer that does not include a die of the first plurality of dies; and
forming a second alignment feature, corresponding to the first alignment feature, on the second wafer, wherein the second alignment feature is included in a second area of the second wafer that does not include a die of the second plurality of dies.

7. The method of claim 1, further comprising:
mounting an electrical integrated circuit to the plurality of contacts, the electrical integrated circuit configured to control a voltage applied across the active gain medium.

8. The method of claim 1, wherein the first passive optical element defines a first waveguide coupled to the active gain medium and a second waveguide coupled to an opposite side of the active gain medium from the first waveguide.

9. A Silicon Photonic Platform, comprising:
a first substrate;
a III-V material joined to the first substrate, the III-V material having a first region of a first height from the first substrate and a second region of a second height from the first substrate that is greater than the first height and including an active gain medium in the second region;
a first insulator disposed on the III-V material and including a first passive waveguide aligned to the active gain medium; and
a second insulator including a second passive waveguide, wherein the second insulator contacts the first insulator along a wafer bonded interface that vertically aligns the second passive waveguide with the first passive waveguide to form an evanescent connection between the first passive waveguide and the second passive waveguide.

10. The Silicon Photonic Platform of claim 9, wherein the second passive waveguide is aligned with the first passive waveguide via wafer-level paired alignment features defined on the first insulator and the second insulator.

11. The Silicon Photonic Platform of claim 9, further comprising a second substrate joined to the second insulator opposite to the first insulator, wherein the second substrate is a same material having a different angle of cut as the first substrate.

12. The Silicon Photonic Platform of claim 11, wherein the second substrate is a different material having a different angle of cut than the first substrate.

13. The Silicon Photonic Platform of claim 9, further comprising:
a plurality of contacts running through the second insulator and the first insulator.

14. The Silicon Photonic Platform of claim 13, further comprising:
an electrical integrated circuit mounted to the plurality of contacts.

15. The Silicon Photonic Platform of claim 13, wherein at least a first contact of the plurality of contacts is in electrically connected with a photodetector included in the second insulator.

16. The Silicon Photonic Platform of claim 13, wherein at least two contacts of the plurality of contacts are electrically connected across the active gain medium.

17. The silicon photonic platform of claim 9, wherein the first passive waveguide is coupled to a first side the active gain medium and a third passive waveguide is coupled to a second side of the active gain medium opposite to the first side.

18. A system, comprising:
a first wafer, including a first substrate and a first insulator, the first insulator including a first plurality of dies that include:
a first region where a III-V material bonded to the first substrate defines a first surface that is a first height from the first substrate;
a second region where the III-V material defines a second surface that is a second height from the first substrate, wherein the second height is greater than the first height;
an active gain medium, defined within the second region of the III-V material at a third height relative to the first substrate, wherein the third height is greater than the first height and less than the second height; and
a first set of optical waveguides defined within the first insulator that is optically coupled with the active gain medium;
a second wafer, including a second substrate and a second insulator, the second insulator including a second plurality of dies that include a second set of optical waveguides; and
a wafer bond interface joining the first insulator with the second insulator and vertically aligning the first plurality of dies with the second plurality of dies such that respective first sets of optical waveguides are optically coupled with respective second sets of optical waveguides to form an evanescent connection between a first passive waveguide defined in the first insulator and a second passive waveguide defined in the second insulator.

19. The system of claim 18, wherein the second plurality of dies include:
a light sensor, defined within the second insulator at a second distance relative to the active gain medium at a third height relative to the first substrate, wherein the light sensor is optically coupled with the active gain medium via a third set of optical waveguides and the first set of optical waveguides.

20. The system of claim 19, further comprising:
a plurality of contacts defined through the first insulator and the second insulator including:
at least one contact in electrical communication with the light sensor; and
at least two contacts in electrical communication with the active gain medium.

* * * * *